(12) United States Patent
Kashyap et al.

(10) Patent No.: US 9,130,365 B2
(45) Date of Patent: Sep. 8, 2015

(54) METHOD AND SYSTEM FOR ULTRA MINIATURIZED PACKAGES FOR TRANSIENT VOLTAGE SUPPRESSORS

(71) Applicant: GENERAL ELECTRIC COMPANY, Schenectady, NY (US)

(72) Inventors: Avinash Srikrishnan Kashyap, Niskayuna, NY (US); Emad Andarawis Andarawis, Ballston Lake, NY (US); David Mulford Shaddock, Troy, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 14/486,138

(22) Filed: Sep. 15, 2014

(65) Prior Publication Data

US 2015/0002976 A1 Jan. 1, 2015

Related U.S. Application Data

(62) Division of application No. 13/420,056, filed on Mar. 14, 2012, now Pat. No. 8,835,976.

(51) Int. Cl.
*H01L 29/66* (2006.01)
*H01L 21/332* (2006.01)
(Continued)

(52) U.S. Cl.
CPC ............... *H02H 1/04* (2013.01); *H01L 21/50* (2013.01); *H01L 21/8213* (2013.01); *H01L 24/16* (2013.01); *H01L 27/0255* (2013.01); *H01L 27/0605* (2013.01); *H01L 27/0814* (2013.01); *H01L 29/861* (2013.01); *H02H 3/20* (2013.01); *H01L 21/8252* (2013.01);
(Continued)

(58) Field of Classification Search
CPC .................................. H01L 24/16; H02H 1/04
USPC ........... 257/111–112, 279, 497; 438/133–136
See application file for complete search history.

(56) References Cited

U.S. PATENT DOCUMENTS 3,551,783 A 12/1970 Reich
4,325,097 A 4/1982 Clark
(Continued)

FOREIGN PATENT DOCUMENTS

EP 0537843 A1 4/1993
EP 1207563 A2 5/2002
(Continued)

OTHER PUBLICATIONS

Four Channel ESD Array, Publication Order No. NUP4103FC, Semiconductor Components Industries, LLC, Mar. 2006, pp. 1-5.

*Primary Examiner* — Calvin Lee
(74) *Attorney, Agent, or Firm* — John P. Darling

(57) ABSTRACT

A high temperature electronic system includes an electronics unit configured for exposure to an environment having a temperature greater than approximately 150.0° C. The remote electronics unit includes a transient voltage suppressor (TVS) assembly coupled in operative relationship with at least some electronic components of the electronics unit. The TVS assembly includes at least one TVS device comprising at least one of a punch-through wide band-gap semiconductor TVS die and an avalanche breakdown wide band-gap semiconductor TVS die encapsulated in a flip-chip package at least partially surrounding the die, and coupled to first and second electrodes exposed to a single side of the encapsulation.

4 Claims, 10 Drawing Sheets

(51) Int. Cl.
   *H02H 1/04* (2006.01)
   *H01L 21/50* (2006.01)
   *H01L 29/861* (2006.01)
   *H01L 21/82* (2006.01)
   *H01L 27/06* (2006.01)
   *H01L 27/08* (2006.01)
   *H01L 27/02* (2006.01)
   *H01L 23/00* (2006.01)
   *H02H 3/20* (2006.01)
   *H01L 29/45* (2006.01)
   *H01L 29/06* (2006.01)
   *H01L 29/16* (2006.01)
   *H01L 29/20* (2006.01)
   *H01L 21/8252* (2006.01)

(52) U.S. Cl.
   CPC ........ *H01L 29/0661* (2013.01); *H01L 29/1602* (2013.01); *H01L 29/1608* (2013.01); *H01L 29/2003* (2013.01); *H01L 29/45* (2013.01)

(56) References Cited

U.S. PATENT DOCUMENTS

| | | | |
|---|---|---|---|
| 5,103,289 | A | 4/1992 | Brady |
| 6,489,660 | B1 | 12/2002 | Einthoven et al. |
| 6,867,436 | B1 | 3/2005 | Matteson et al. |
| 7,187,012 | B2 | 3/2007 | Walters |
| 7,339,776 | B1 | 3/2008 | Hertel et al. |
| 7,361,942 | B1 | 4/2008 | Matteson et al. |
| 7,510,903 | B1 | 3/2009 | Matteson et al. |
| 8,338,854 | B2 | 12/2012 | Bobde et al. |
| 8,445,917 | B2 | 5/2013 | Haney et al. |
| 8,530,902 | B2 | 9/2013 | Kashyap et al. |
| 8,835,976 | B2 * | 9/2014 | Kashyap et al. ............. 257/112 |
| 2002/0195689 | A1 | 12/2002 | Lee et al. |
| 2005/0006731 | A1 | 1/2005 | O'Shea et al. |
| 2006/0012053 | A1 | 1/2006 | Lai |
| 2007/0077738 | A1 | 4/2007 | Tanielian et al. |
| 2008/0079126 | A1 | 4/2008 | Autry et al. |
| 2009/0015978 | A1 | 1/2009 | Clark |
| 2009/0079093 | A1 | 3/2009 | Moran et al. |
| 2009/0290276 | A1 | 11/2009 | Carcouet et al. |
| 2010/0109147 | A1 | 5/2010 | Autry |
| 2010/0127365 | A1 | 5/2010 | Galera et al. |
| 2010/0237356 | A1 | 9/2010 | Haney et al. |
| 2011/0133337 | A1 | 6/2011 | Shau |
| 2011/0175218 | A1 | 7/2011 | Liou et al. |

FOREIGN PATENT DOCUMENTS

| | | |
|---|---|---|
| GB | 1447763 | 9/1976 |
| GB | 2341018 A | 3/2000 |

\* cited by examiner

METHOD AND SYSTEM FOR ULTRA MINIATURIZED PACKAGES FOR TRANSIENT VOLTAGE SUPPRESSORS

CROSS REFERENCE TO RELATED APPLICATION

This application is a divisional of U.S. application Ser. No. 13/420,056, filed on Mar. 14, 2012 now U.S. Pat. No. 8,835,976 issued Sep. 16, 2014.

BACKGROUND

The disclosure relates generally to high temperature semiconductor devices, and more specifically, to semiconductor devices for transient voltage suppression in high temperature environments.

At least some known sensitive electronic equipment use Transient Voltage Suppression (TVS) devices to protect the equipment from lightning strikes or electromagnetic interference (EMI). High power TVS devices are typically available only as discrete devices that are electrically coupled together at the circuit board level to attain the electrical characteristics needed in a particular application. Several TVS devices and/or other components are often connected in parallel and/or series to obtain a required breakdown voltage and current carrying capability. Connecting multiple components together on a circuit board increases the area of the board considerably, which also increases a weight of for example, an aircraft and the heat generated by the multiple components.

BRIEF DESCRIPTION

A high temperature electronic system includes an electronics unit configured for exposure to an environment having a temperature greater than approximately 150.0° C., the remote electronics unit including a transient voltage suppressor (TVS) assembly coupled in operative relationship with at least some electronic components of the electronics unit, the TVS assembly including at least one TVS device including at least one of a punch-through wide band-gap semiconductor TVS die and an avalanche breakdown wide band-gap semiconductor TVS die encapsulated in a flip-chip package at least partially surrounding the die, and coupled to electrodes exposed to a single side of the encapsulation.

BRIEF DESCRIPTION OF THE DRAWINGS

These and other features, aspects, and advantages of the present technique will become better understood when the following detailed description is read with reference to the accompanying drawings in which like characters represent like parts throughout the drawings, wherein.

DETAILED DESCRIPTION

The following detailed description illustrates embodiments of the system by way of example and not by way of limitation. It is contemplated that the systems and methods have general application to electronic component manufacturing and packaging in power electronics, signal electronics, and electromagnetic interference (EMI) protection in industrial, commercial, and residential applications.

As used herein, an element or step recited in the singular and preceded with the word "a" or "an" should be understood as not excluding plural elements or steps, unless such exclusion is explicitly recited. Furthermore, references to "one embodiment" of the present invention are not intended to be interpreted as excluding the existence of additional embodiments that also incorporate the recited features.

Embodiments of the present disclosure demonstrate a semiconductor based TVS device that includes flip-chip packaging methods to reduce the overall area of the package. In various embodiments, a plurality of high power TVS devices are combined in the same package to provide protection for multiple I/O lines from a single device. The TVS device may include a PN junction diode connected in series with the TVS device in the single package if a very low capacitance, for example, approximately 10 picoFarads (pF) to approximately 20 pF is required, for example, if the TVS is used protect communication lines. Coupling a relatively high capacitance TVS device to a load may tend to adversely load the downstream electronics. As described herein, the PN junction diode is also combined electrically with the TVS device in the same die, thereby reducing the overall area of the TVS assembly.

Currently, known TVS devices are used extensively in several areas in electrical systems, for example, the electrical systems of an aircraft. For example, a FADEC has approximately 200 TVS parts in it. These devices occupy valuable board area, especially if multiple devices are connected in series in order to achieve a predetermined breakdown voltage/power rating combination or if multiple devices are needed to connect a plurality of input/output (I/Os) devices in close proximity. Embodiments of the present disclosure describe methods and apparatus configured to reduce the size of the TVS device by (a) using a wide band-gap semiconductor-based device rather than silicon-based semiconductor devices, (b) combining a TVS device and a diode on the same die, (c) using flip-chip packaging methods, and/or (d) combining several TVS parts inside the same package.

Figure 1:
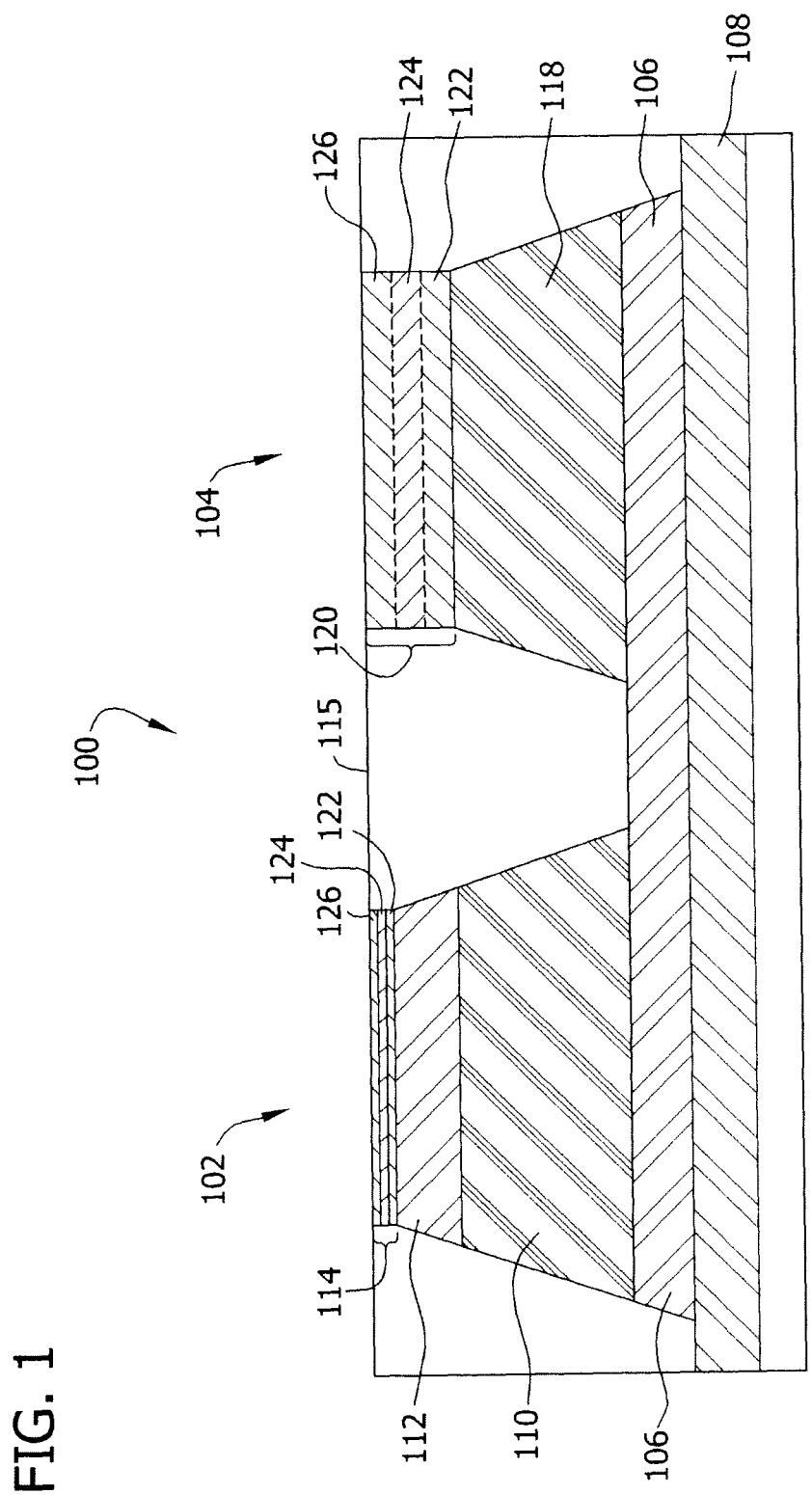
FIG. 1 is a side elevation view of a transient voltage suppression (TVS) assembly according to the present technique.

FIG. 1 is a side elevation view of a transient voltage suppression (TVS) assembly 100 according to an exemplary embodiment of the present system. In the exemplary embodiment, TVS assembly 100 includes a TVS device 102 and a PN junction 104 electrically coupled in series through a semiconductor layer 106 comprising a first polarity, for example, an N+ polarity based on the doping implemented in the fabrication of semiconductor layer 106. Semiconductor layer is grown on or coupled to a substrate 108. In various embodiments, substrate 108 may be fabricated from an electrical insulator material, a semi-insulating material, or a first wide band gap semiconductor having a conductivity of the first polarity. In one embodiment, substrate 108 is formed of an insulating material, for example, but not limited to, Silicon Dioxide ($SiO_2$), Sapphire, and quartz or a semi-insulating material such as, but not limited to, un-doped Silicon Carbide.

TVS device 102 includes a mesa structure that is formed on semiconductor layer 106. An epitaxially grown P– layer 110 is coupled in electrical contact with semiconductor layer 106. An epitaxially grown N+ layer 112 is coupled in electrical contact with P– layer 110. In the exemplary embodiment, P– layer 110 is relatively lightly doped relative to the N+ layers 106 and 112. A uniform doping concentration of semiconductor layer 106 and layers 110 and 112 improves a uniformity of the electric field distribution in the depletion region of layer 110, thereby improving the breakdown voltage characteristic. Moreover, the mesa structure has a beveled sidewall angled approximately five degrees to approximately 90 degrees with respect to an interface between adjacent contacting layers to reduce the maximum electric field profile at a surface of the die. A first electrical contact 114 is coupled in electrical contact with layer 112 and extends to a contact surface 115 of TVS assembly 100.

PN junction 104 is formed similarly as TVS device 102. An epitaxially grown P– layer 118 is coupled in electrical contact with layer 106. A second electrical contact 120 is coupled in electrical contact with layer 118 and extends to contact surface 115. Electrical contacts 114 and 120 may be formed by sputtering, vapor deposition, evaporation, or other method for adhering a metal contact surface to semiconductor surfaces of layers 112 and 118. In various embodiments, electrical contacts 114 and 120 include sublayers of different materials. For example, contacts 114 and 120 may include a first sublayer 122 comprising, for example, nickel (Ni), which possesses good adherence characteristics with respect to the semiconductor material of layer 112 and 118. A second sublayer 124 comprising for example, tungsten (W) is deposited onto Ni sublayer 122 and a third sublayer comprising, for example, gold (Au) is deposited onto W sublayer 124. W and Au are used to provide lower resistivity for electrical contacts 114 and 120. Although, described herein as comprising sublayers of Ni, W, and Au, it should be recognized that electrical contacts 114 and 120 may comprise more or less that three sublayers comprising the same or different materials than Ni, W, and Au, or alloys thereof.

In the exemplary embodiment, TVS assembly 100 is formed in a "flip chip" configuration. Accordingly, electrical contacts 114 and 120 are oriented on the same side of TVS assembly 100. Moreover, TVS device 102 operates using "punch-through," or also known as, "reach-through" physics such that as the voltage across TVS device 102 is increased, a depletion region extends all across P– layer 110 and touches N+ layers 106 and 112. This leads to a condition known as "punch-through" and large amounts of current are able to flow through TVS device 102. TVS device 102 is able to maintain this condition with minimal change in the voltage across it.

In various embodiments, TVS device 102 is sized and formed to ensure a maximum electric field internal to the semiconductor material of TVS device 102 is maintained less than two megavolts per centimeter. Additionally, TVS device 102 is configured to maintain an increase in blocking voltage of less than 5% for current in a range of less than approximately 1.0 nanoamp to approximately 1.0 milliamp. As used herein, blocking voltage refers to the highest voltage at which TVS device 102 does not conduct or is still in an "off" state. Moreover, TVS device 102 is configured to maintain an electrical leakage current of less than approximately 1.0 microamp up to approximately the punch-through voltage of TVS device 102 at room temperature and less than 1.0 microamp up to approximately the punch-through voltage at operating temperatures of up to 225° Celsius.

In various embodiments, TVS device 102 is configured to exhibit punch through characteristics between approximately 5.0 volts to approximately 75.0 volts. In various other embodiments, TVS device 102 is configured to exhibit punch through characteristics between approximately 75.0 volts to approximately 200.0 volts. In still other embodiments, TVS device 102 is configured to exhibit punch through characteristics greater than approximately 200 volts.

Although the semiconductor material used to form TVS device 102 and PN junction 104 is described herein as being silicon carbide, it should be understood that the semiconductor material may include other wide band-gap semiconductors capable of performing the functions described herein and in the environments described herein.

Figure 2:
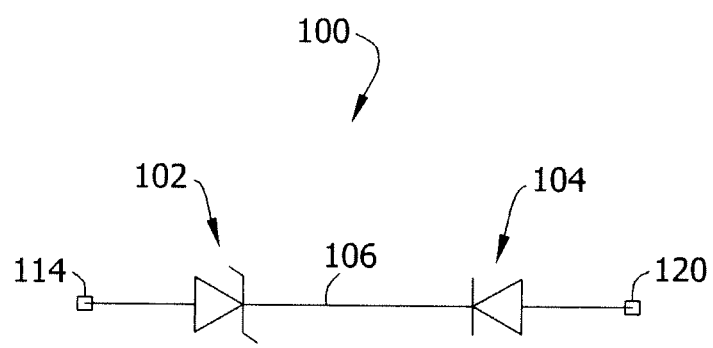
FIG. 2 is a schematic diagram of the TVS assembly shown in FIG. 1.

FIG. 2 is a schematic diagram of TVS assembly 100 (shown in FIG. 1). TVS assembly 100 includes TVS device 102 electrically coupled in series with PN junction 104 through substrate 106.

Figure 3:
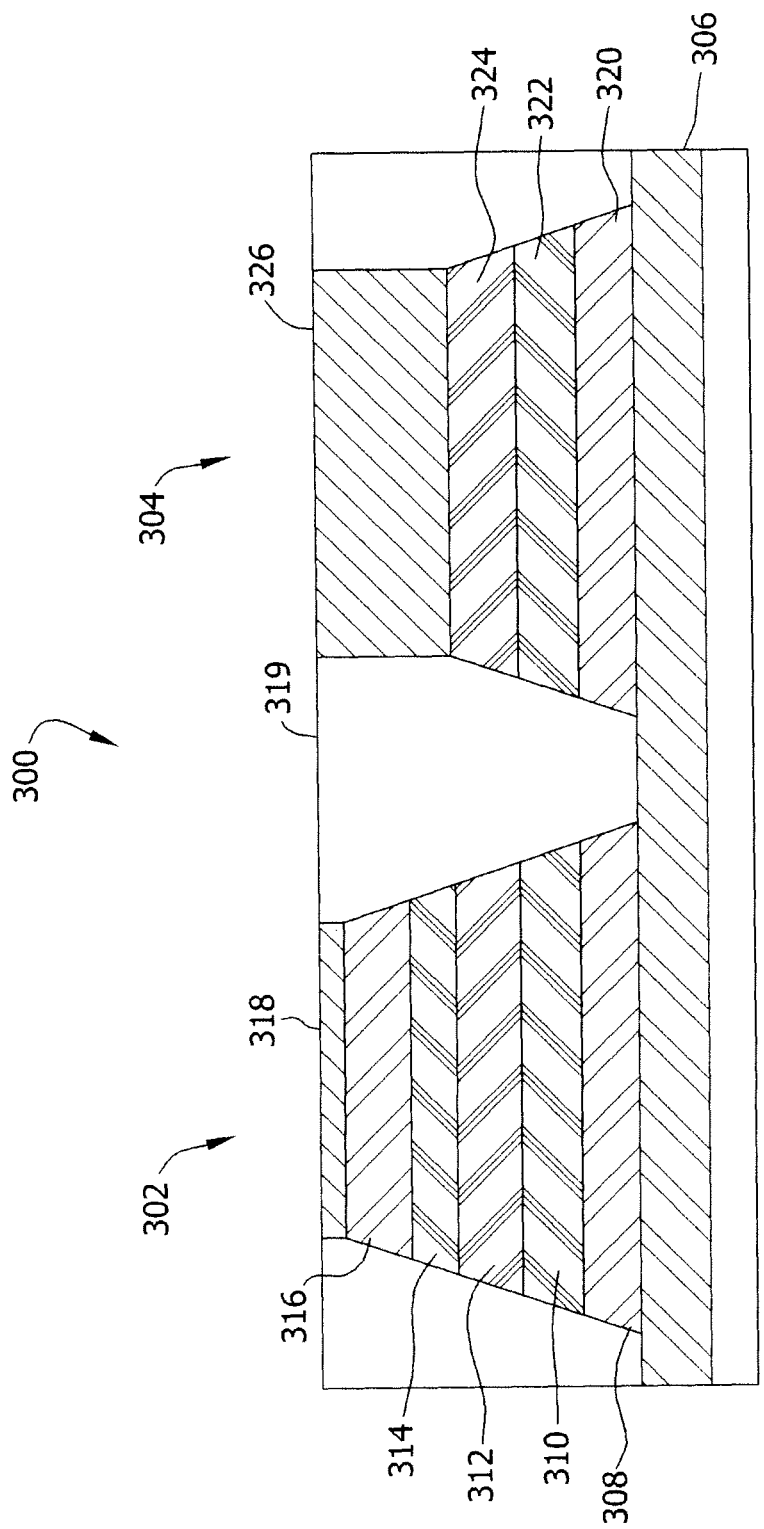
FIG. 3 is a side elevation view of a TVS assembly according to the present technique.

FIG. 3 is a side elevation view of a TVS assembly 300 according to an embodiment of the present system. In the exemplary embodiment, TVS assembly 100 includes a TVS device 302 and a PN junction 304 electrically coupled in series through a semiconductor substrate 306 comprising a first polarity, for example, an N+ polarity based on the doping implemented in the fabrication of substrate 306. In the exemplary embodiment, PN junction 304 facilitates reducing an impedance, specifically a capacitance of TVS assembly 300 to reduce electrical loading on downstream components.

TVS assembly 300 operates using a different electrical principle than TVS assembly 100 (shown in FIG. 1). Whereas TVS assembly 100 operates using "punch through" physics, TVS assembly 300 uses "avalanche breakdown", which is the result of carrier "impact ionization." Impact ionization is a process that occurs in a space charge region or depletion region of TVS device 302 under a sufficiently high electric field which is the result of the voltage difference across TVS device 302. At that high field the net electron/hole generation rate due to impact ionization exceeds a critical value, enabling the current to rise indefinitely due to a positive feedback mechanism.

TVS device 302 includes a mesa structure that is formed on substrate 306 of for example, silicon carbide or other wide band-gap semiconductor material having an N+ type conductivity. In the exemplary embodiment, an N+ type conductivity layer 308 is epitaxially grown on substrate 306. A first epitaxially grown P– layer 310 is coupled in electrical contact with layer 308. An epitaxially grown P+ layer 312 is coupled in electrical contact with P– layer 310. A second epitaxially grown P– layer 314 is coupled in electrical contact with layer 312. A second N+ type conductivity layer 316 is epitaxially grown on P– layer 314. A first electrical contact 318 is coupled in electrical contact with layer 316 and extends to a contact surface 319.

PN junction 304 is formed similarly as TVS device 302. An N+ type conductivity layer 320 is epitaxially grown on substrate 306. An epitaxially grown P– layer 322 is coupled in electrical contact with layer 320. An epitaxially grown P+ layer 324 is coupled in electrical contact with P– layer 322. A second electrical contact 326 is coupled in electrical contact with layer 324 and extends to contact surface 319. Similar to TVS assembly 100, electrical contacts 318 and 326 may be formed by sputtering, vapor deposition, evaporation, or other method for adhering a metal contact surface to semiconductor surfaces of layers 316 and 324. In various embodiments, electrical contacts 318 and 326 are formed identically to electrical contacts 114 and 120 (shown in FIG. 1).

Although the semiconductor material used to form TVS device 302 and PN junction 304 is described herein as being silicon carbide, it should be understood that the semiconductor material may include other wide band-gap semiconductors capable of performing the functions described herein and in the environments described herein.

Figure 4:
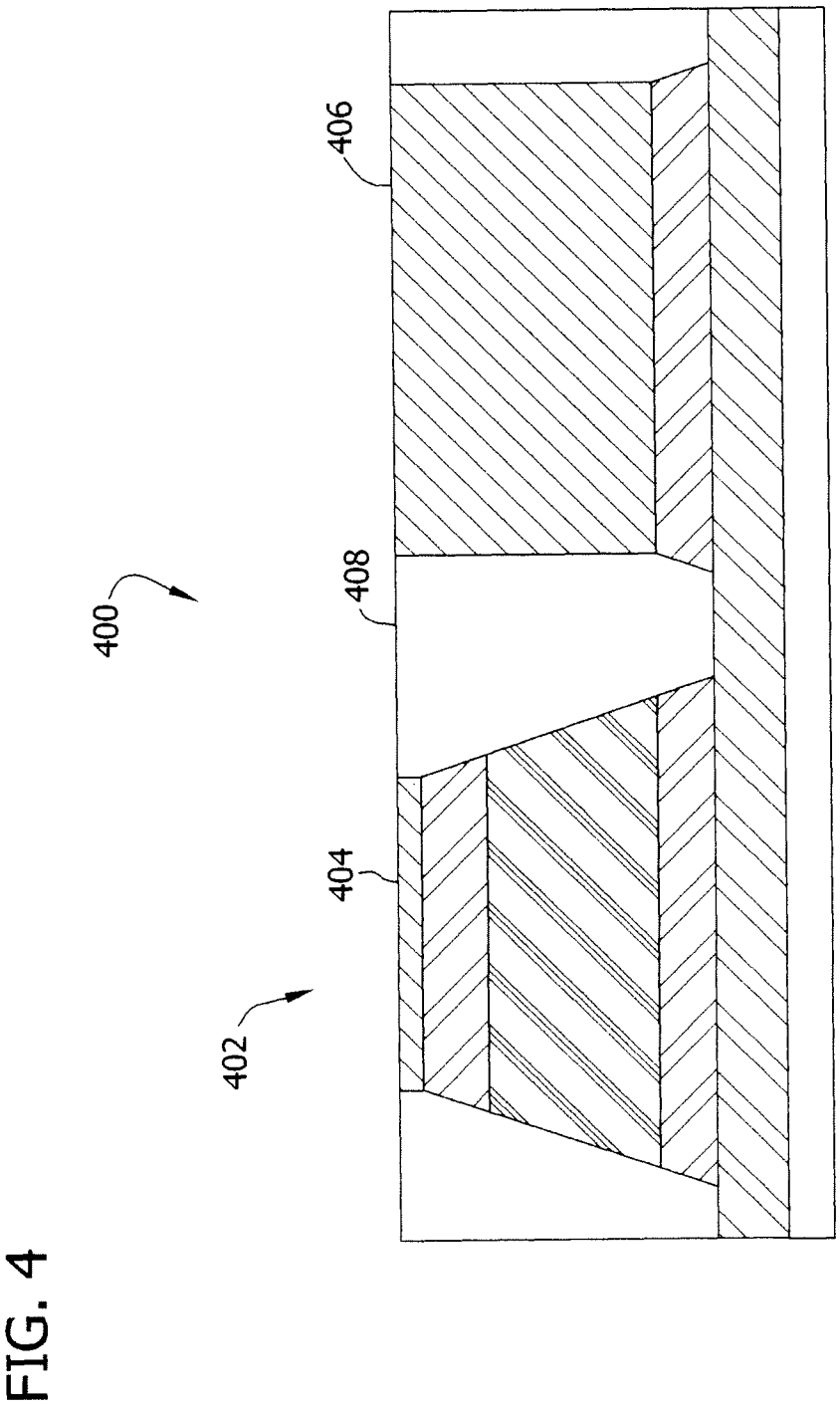
FIG. 4 is a side elevation view of a TVS assembly according to the present technique.

FIG. 4 is a side elevation view of a TVS assembly 400 according to an exemplary embodiment of the present invention. In the exemplary embodiment, TVS assembly 400 includes only a punch-through based TVS device 402 in a "flip-chip" configuration wherein each of for example, two electrical contacts 404 and 406 to circuitry offboard TVS assembly 400 extend to a contact surface 408. TVS assembly 400 is substantially similar to TVS assembly 100 (shown in FIG. 1) without a PN junction.

Figure 5:
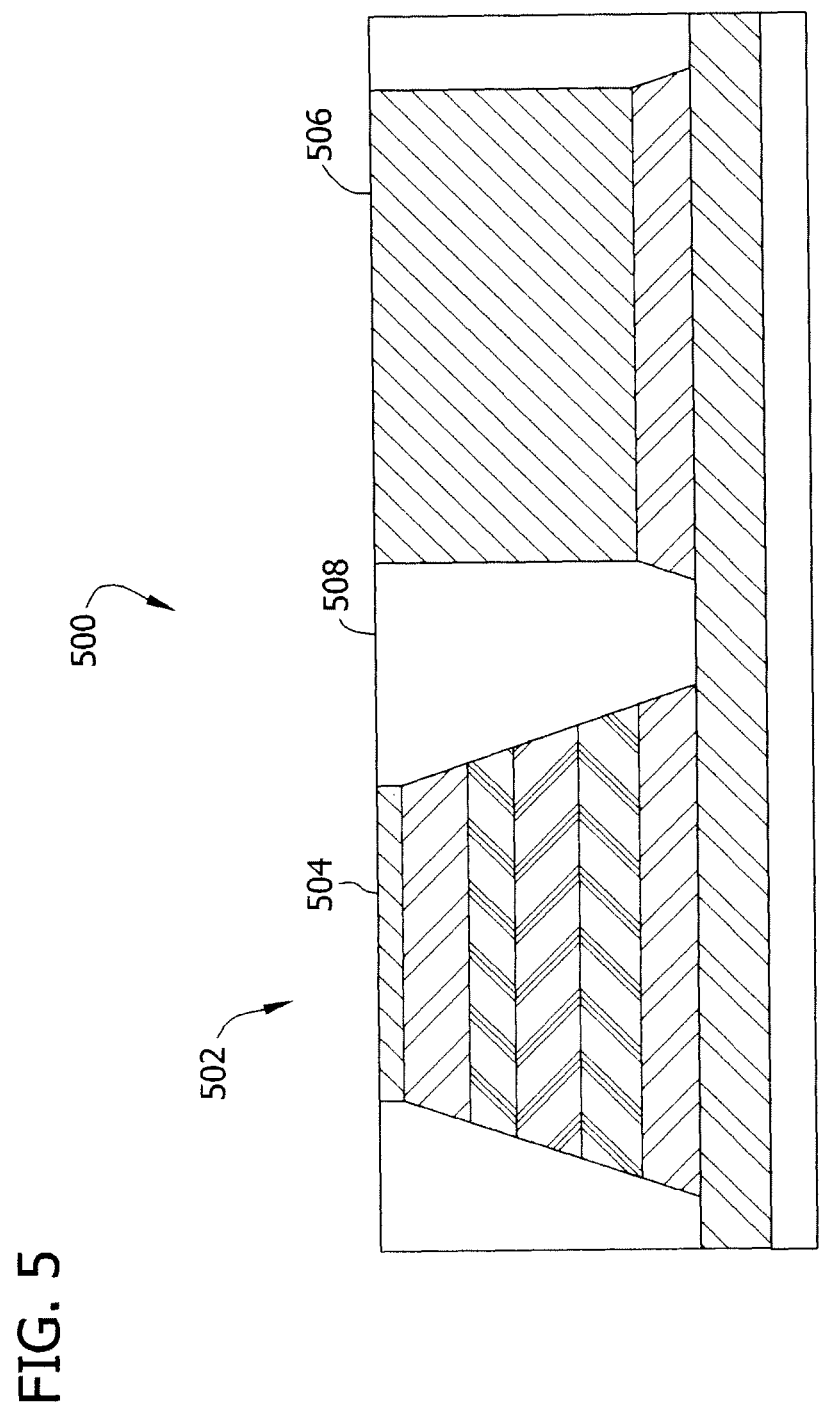
FIG. 5 is a side elevation view of a TVS assembly according to the present technique.

FIG. 5 is a side elevation view of a TVS assembly 500 according to an exemplary embodiment of the present invention. In the exemplary embodiment, TVS assembly 500 includes only an avalanche-breakdown based TVS device 502 in a "flip-chip" configuration wherein each of for example, two electrical contacts 504 and 506 to circuitry offboard TVS assembly 500 extend to a contact surface 508. TVS assembly 500 is substantially similar to TVS assembly 300 (shown in FIG. 3) without a PN junction.

Figure 6:
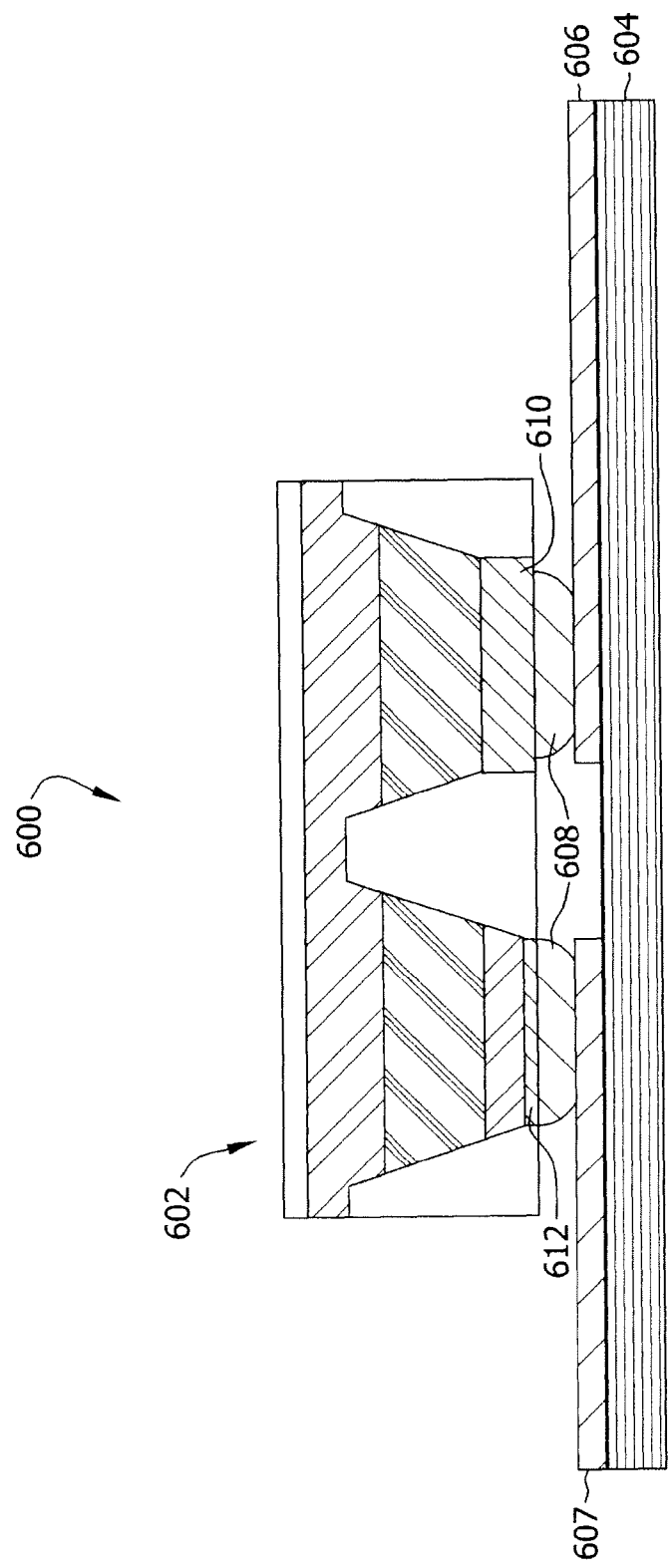
FIG. 6 is a side elevation view of a TVS assembly according to the present technique.

FIG. 6 is a side elevation view of a TVS assembly 600 according to an exemplary embodiment of the present invention. In the exemplary embodiment, TVS assembly 600 may include a punch-through or avalanche-breakdown based TVS device 602 and may or may not include a capacitance-reducing PN junction formed in electrical series with TVS device 602. TVS assembly 600 is shown flipped onto a printed circuit board 604 having conductive traces 606 and 607 routed along predetermined paths to carry current between various components mounted on printed circuit board 604. In the exemplary embodiment, solder 608 is used to electrically connect a first electrical contact 610 to trace 606 and to electrically connect a second electrical contact 612 to trace 607.

Figure 7A:
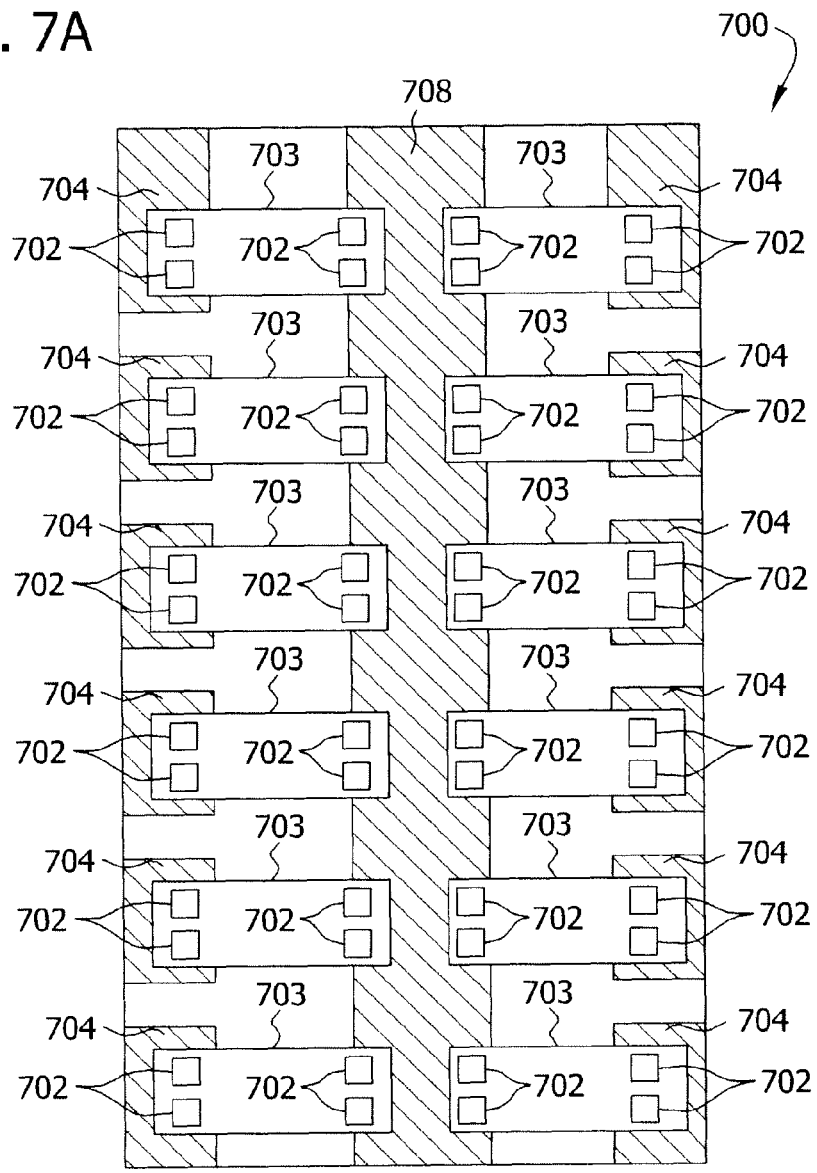
FIG. 7A is a cutaway plan view of a TVS package according to the present technique.
Figure 7B:
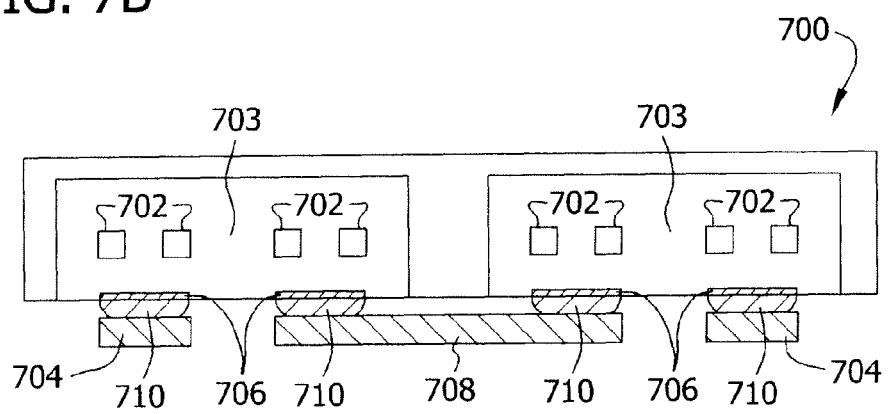
FIG. 7B is a side elevation view of the TVS package shown in FIG. 7A.

FIG. 7A is a cutaway plan view of a TVS package 700 according to an exemplary embodiment of the present invention. FIG. 7B is a side elevation view of TVS package 700. In the exemplary embodiment, TVS package 700 includes a plurality of individual TVS devices 702 fabricated as independent devices on the same semiconductor die 703. In the exemplary embodiment, each semiconductor die 703 is electrically coupled to traces 704 that are routed among various components on a circuit board (not shown in FIG. 7A or 7B). Also in the exemplary embodiment, one electrical terminal 706 of each semiconductor die 703 is coupled to a common trace 708, such as, an electrical ground. In various embodiments, electrical terminals 706 of each semiconductor die 703 are coupled to other than common trace 708. TVS package 700 may be encapsulated or over-molded using, for example, but not limited to a plastic. Electrical terminals 706 are electrically coupled to traces 704 and 708 using, for example, but not limited to, solder, transient liquid phase (TLP) bonding, and thermocompression bonding. As used herein, transient liquid phase bonding refers to a joining process for bonding metallic systems. TLP produces joints with a uniform composition profile, tolerant of surface oxides and geometrical defects, and a remelt temperature higher than the bonding temperature. For example, in the exemplary embodiment, the interlayer and parent metal compositions are selected such that the TLP bond has a bonding temperature of approximately 280° C. and a remelt temperature of approximately 600° C. In various embodiments, the TLP bond may include gold rich, gold, silver or nickel tin, indium, or combinations thereof. Additionally, other TLP interlayers and parent metals are contemplated.

Figure 8A:
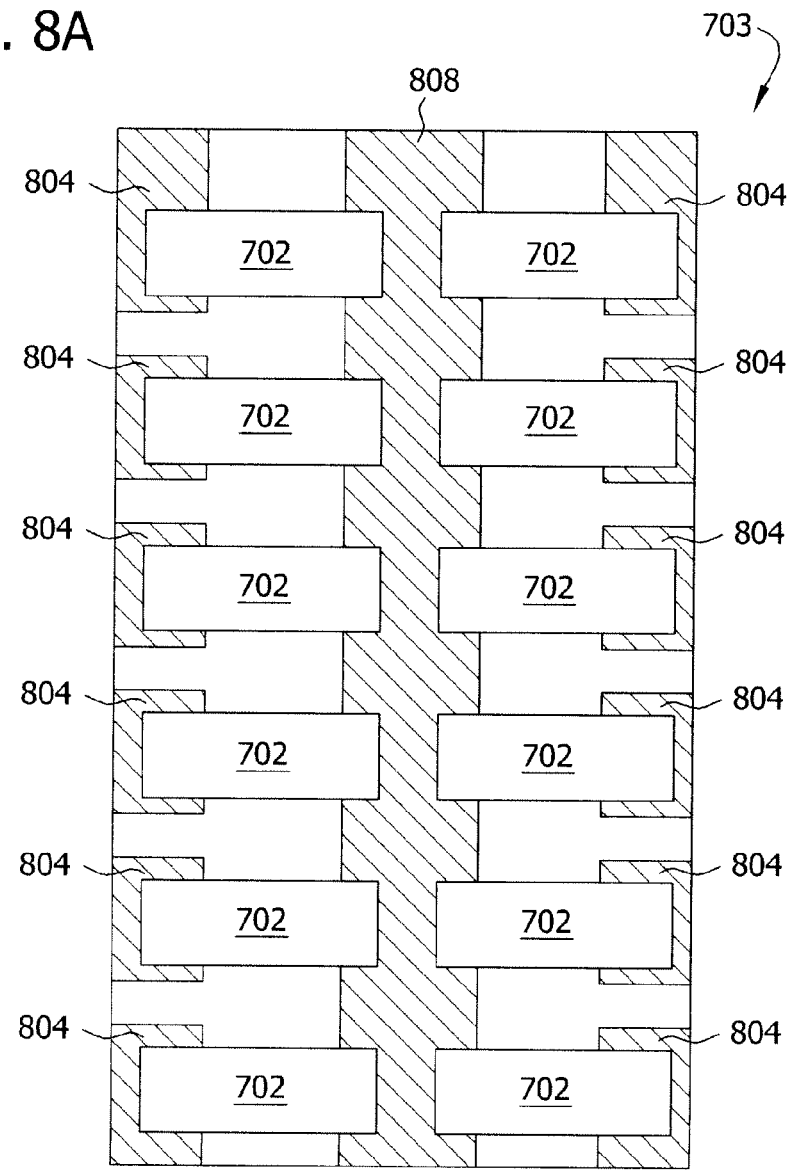
FIG. 8A is a cutaway plan view of a TVS die according to the present technique.
Figure 8B:
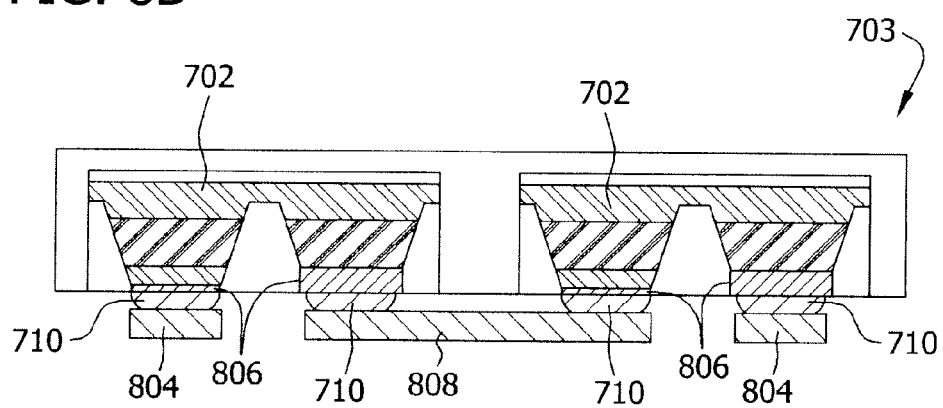
FIG. 8B is a side elevation view of the TVS die shown in FIG. 8A.

FIG. 8A is a cutaway plan view of TVS die 703 according to another embodiment of the present invention. FIG. 8B is a side elevation view of TVS die 703. In the exemplary embodiment, TVS die 703 includes a plurality of individual TVS devices 702 fabricated as independent semiconductor circuits. The individual TVS circuits may be coupled together in series, parallel, or a combination thereof. In the exemplary embodiment, each semiconductor die 703 is electrically coupled to traces 804 that are routed among various components on a circuit board (not shown in FIG. 8A or 8B). Also in the exemplary embodiment, another electrical terminal 806 of each semiconductor die 703 is coupled to a common trace 808, such as, an electrical ground. In various embodiments, electrical terminals 806 of each semiconductor die 703 are coupled to other than common trace 808.

Figure 9A:
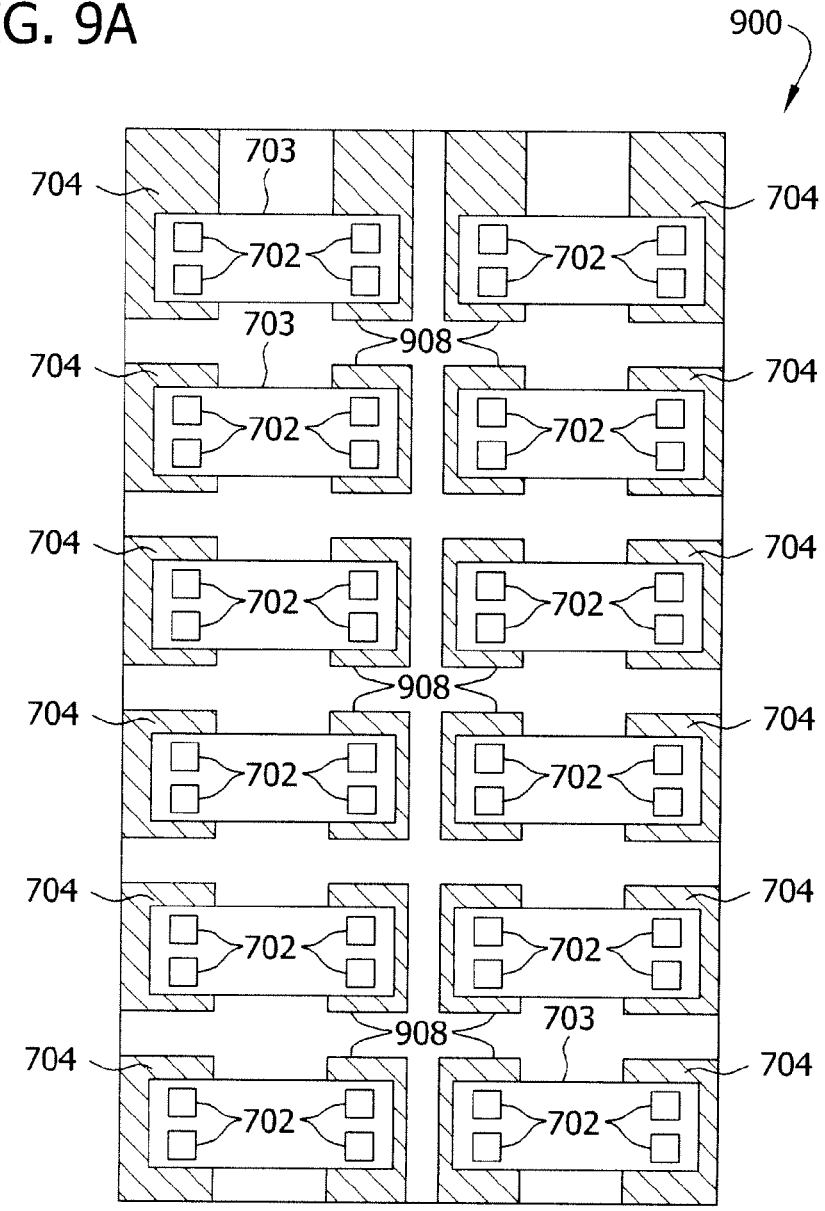
FIG. 9A is a cutaway plan view of a TVS package according to the present technique.
Figure 9B:
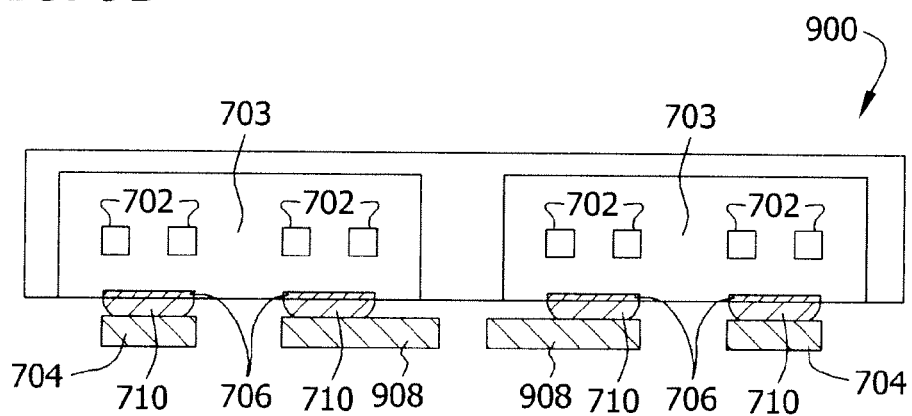
FIG. 9B is a side elevation view of the TVS package shown in FIG. 9A.

FIG. 9A is a cutaway plan view of a TVS package 900 according to an exemplary embodiment of the present invention. FIG. 9B is a side elevation view of TVS package 900. In the exemplary embodiment, TVS package 900 includes a plurality of individual TVS devices 702 fabricated as independent devices on the same semiconductor die 703. In the exemplary embodiment, each semiconductor die 703 is electrically coupled to traces 704 and 908 that are routed among various components on a circuit board (not shown in FIG. 9A or 9B). In various embodiments, trace 704 or trace 908 is coupled to, for example, an electrical ground. TVS package 700 may be encapsulated or over-molded using, for example, but not limited to a plastic. Electrical terminals 906 are electrically coupled to traces 704 and 908 using, for example, but not limited to, solder, transient liquid phase (TLP) bonding, and thermocompression bonding as described above.

Figure 10A:
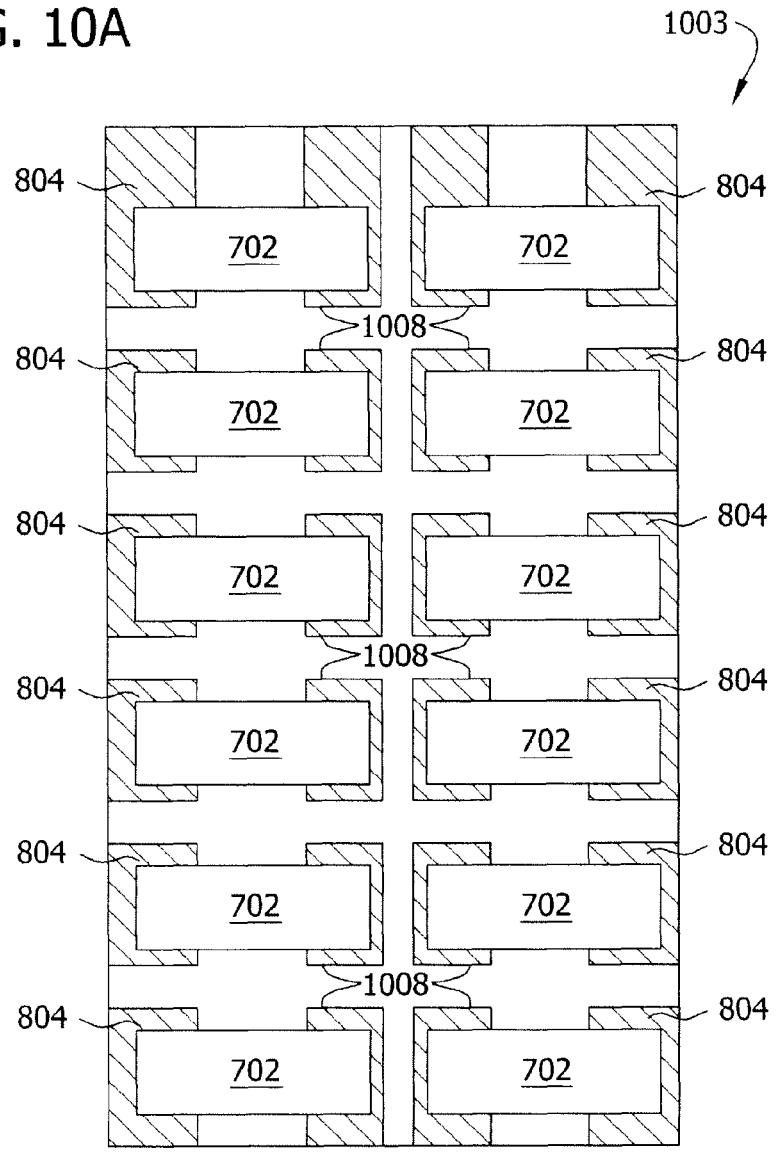
FIG. 10A is a cutaway plan view of a TVS die according to the present technique.
Figure 10B:
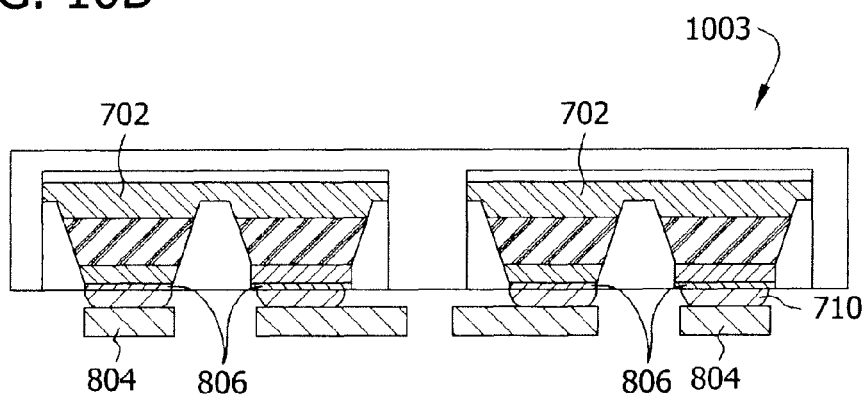
FIG. 10B is a side elevation view of the TVS die shown in FIG. 10A.

FIG. 10A is a cutaway plan view of a TVS die 1003 according to another embodiment of the present invention. FIG. 10B is a side elevation view of TVS die 1003. In the exemplary embodiment, TVS die 1003 includes a plurality of individual TVS devices 702 fabricated as independent semiconductor circuits. The individual TVS circuits may be coupled together in series, parallel, or a combination thereof. In the exemplary embodiment, each semiconductor die 1003 is electrically coupled to traces 804 and 1008 that are routed among various components on a circuit board (not shown in FIG. 10A or 10B). In various embodiments, trace 804 or trace 1008 is coupled to, for example, an electrical ground.

In various embodiments, the TVS devices are illustrated as mesa structures, however the TVS devices can also be formed in frusto-conical structures, cylindrical structures, or combinations thereof, for example, a frusto-conical portion and cylindrical portion formed in series, or two frusto-conical portion formed in series.

Where a semiconductor is referred to as having one type of polarity layer coupled to a different polarity layer, it should be understood that the device formed by the semiconductor materials is capable of also operating when the polarities of the layers is reversed. Examples of only one configuration are given for simplicity in the explanation.

The above-described embodiments of a method and system of transient voltage suppression provides a cost-effective and reliable means for reducing and/or eliminating voltage spikes induced into electrical systems such as from EMI and/or lightning strikes. More specifically, the methods and systems described herein facilitate high density wide band-gap TVS structures that are physically smaller and more environmentally robust than typical silicon-based semiconductor devices. In addition, the TVS devices described herein reduce the circuit board area required to site the devices, which directly aids in increasing the density of the rest of the system electronics. Moreover, by using a lesser number of TVS devices, the overall system weight is reduced. Because of the use of wide-band gap semiconductor materials, such as, but not limited to, silicon carbide, the TVS devices can be used in a high temperature environment, for example, environments greater than 150.0° Celsius. By combining several TVS devices into one die and by reducing the area of the die itself through the usage of SiC or other wide band-gap semiconductors, the cost of TVS assemblies can be reduced. In addition, the above-described methods and systems facilitate operating electronic components in high density housings without additional cooling support. As a result, the methods and systems described herein facilitate operating vehicles, such as aircraft in a cost-effective and reliable manner.

This written description uses examples to disclose the inventions, including the best mode, and also to enable any person skilled in the art to practice the inventions, including making and using any devices or systems and performing any incorporated methods. The patentable scope of the inventions are defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A high temperature electronic system comprising an electronics unit configured for exposure to an environment having a temperature greater than approximately 150.0° C., said remote electronics unit comprising a transient voltage suppressor (TVS) assembly coupled in operative relationship with at least some electronic components of the electronics unit, said TVS assembly comprising at least one TVS device comprising at least one of a punch-through wide band-gap semiconductor TVS die and an avalanche breakdown wide band-gap semiconductor TVS die encapsulated in a flip-chip package at least partially surrounding said die, and coupled to first and second electrodes exposed to a single side of the encapsulation.

2. A high temperature electronic system according to claim 1, wherein said die comprises a plurality of TVS assemblies each comprising separate first electrical connections and second electrical connections electrically coupled to a common bus, said first electrical connections and said second electrical connections all exposed to the single side of the encapsulation.

3. A high temperature electronic system according to claim 1, wherein said die comprises a plurality of TVS assemblies each comprising separate first and second electrodes exposed to the single side of the encapsulation.

4. A high temperature electronic system according to claim 1, wherein at least some of the TVS assemblies further comprise a PN junction configured to reduce a capacitance of the respective TVS assembly, said PN junction coupled in electrical series with said TVS device between respective first and second electrodes.

* * * * *